United States Patent [19]

Nady, II et al.

[11] Patent Number: 4,912,401
[45] Date of Patent: Mar. 27, 1990

[54] CONNECTION APPARATUS FOR INTERACTIVELY ACCESSING AN ELECTRONIC DEVICE IN A PIN GRID ARRAY SOCKET

[75] Inventors: Anthony M. Nady, II, Cornelius; David G. Payne, Aloha, both of Oreg.

[73] Assignee: Tektronix, Inc., Beaverton, Oreg.

[21] Appl. No.: 300,452

[22] Filed: Jan. 18, 1989

[51] Int. Cl.$^4$ ............................................. G01R 31/02
[52] U.S. Cl. ................................................... 324/158 F
[58] Field of Search ........... 324/158 F, 73 PC, 158 P, 324/72.5; 439/65, 290, 291

[56] References Cited

PUBLICATIONS

Intel, ICE-386 In-Circuit Emulator for the 80386 data sheet, Oct. '87, pp. 1-12.

Primary Examiner—Ernest F. Karlsen
Attorney, Agent, or Firm—Boulden G. Griffith

[57] ABSTRACT

A connection apparatus for interactively accessing over signal paths of minimum length the signals by which an electronic device with a large number of pins communicates with its environment through a pin grid array socket includes two printed circuit boards, each having a pin grid array socket or a plurality of individual receptacles for pins arranged in a pin grid array pattern, stacked vertically with their pin grid arrays vertically aligned. Each of these circuit boards has a receptacle side on top and a partial array of associated pins on the bottom. The total number of locations in these pin grid arrays exceeds the number of pins on the device, so that signals may be interrupted by the absence of a pin on the bottom of the top board, rerouted for interactive monitoring, sent to the bottom board by a pin in a location not used by the electronic device, and rerouted back to its original location in the pin grid array by runs on the bottom board so that it may be presented to a pin grid array socket in the device's environment by a pin in that location on the bottom of the bottom board. Circuitry for manipulating or emulating the interrupted signals can be placed on the top board where it is very close to the electronic device.

5 Claims, 3 Drawing Sheets

CONNECTION APPARATUS FOR INTERACTIVELY ACCESSING AN ELECTRONIC DEVICE IN A PIN GRID ARRAY SOCKET

BACKGROUND OF THE INVENTION

This invention relates to the field of electrical connectors or probes, and more particularly to the field of connectors for accessing and, in the case of some, interrupting electrical signals going to and from electronic devices mounted in pin grid arrays.

Microprocessor system development tools, such as emulators and logic analyzers, require a connection or probing means for accessing the signal lines used for communication between the microprocessor and its environment, thus permitting the information that these signals contain to be monitored. Furthermore, it is desirable to be able to interrupt some of these signal lines so that information from the development tools can be substituted for information from the microprocessor. Additionally, it is highly desirable to keep the signal paths between the microprocessor and its normal environment, including those paths that are interrupted, as short as possible to minimize undesired electrical effects such as excessive stray capacitance and lengthy propagation times.

For dual-in-line microprocessor pinout arrangements, solutions of the prior art, accomplished most of these objectives to a satisfactory level by placing a target socket for receiving the microprocessor on one side of a circuit board or flexible circuit board immediately adjacent to a connection socket on the other side of the circuit board or flexible circuit board, with a combination of direct runs and interrupted runs connecting the two sockets.

However, as the number of pins on devices increased, high-density interconnection schemes, such as pin grid arrays, have become the norm and the difficulty of accessing so many signals concentrated in so small an area has increased. Accordingly, what is desired is a means for interactively accessing over signal paths of minimum length the signals by which an electronic device having a large number of pins communicates with its environment through a pin grid array.

SUMMARY OF THE INVENTION

The present invention is a means for interactively accessing over signal paths of minimum length the signals by which an electronic device with a large number of pins communicates with its environment through a pin grid array socket.

Two printed circuit boards, each having pin grid array socket or a plurality of individual receptacles for pins arranged in a pin grid array, are stacked vertically with their pin grid arrays vertically aligned. Each of these circuit boards has a receptacle side on top and a partial array of associated pins on the bottom. While all of the receptacles in the array on the top board make electrical connection to the top board, only some of them have associated pins protruding from the lower side of the top board. Where there are pins, these line up with and connect to the corresponding receptacles in the pin grid array on the bottom board. In those locations where there are no pins associated with the top array, the signal is interrupted between the two boards and may be rerouted and processed before being sent to the bottom board using locations in the pin grid array that are not used by the electronic device.

The pin grid array in the bottom board has pins in all the locations normally used by the electronic device, so that the connection to the environment of the device can be made normally. Those signals that were interrupted and sent to the lower board via the normally unused locations in the pin grid array are rerouted by the lower board back to their expected locations in the array for presentation to the electronic device's environment.

Circuitry for capturing or emulating signals passing to and from the electronic device can be placed on one of the boards where it is very close to the electronic device. The total distance added to the signal path is less than three quarters of an inch for those signals that pass straight through the stack and only a couple of inches for those signals that are interrupted and rerouted. The result is a very efficient means for accessing the signals that adds a minimum of undesired electrical effects, while still permitting the accessed signals to be interrupted and manipulated by the accessing instrument.

DETAILED DESCRIPTION

Figure 1:
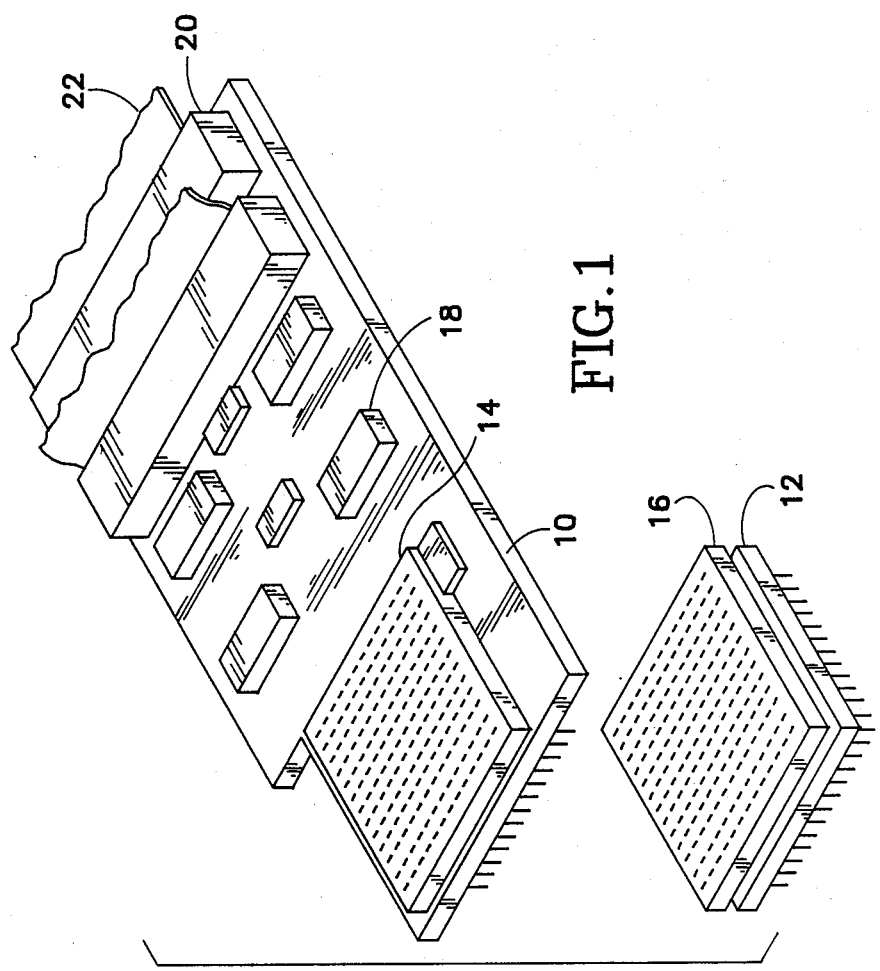
FIG. 1 is a perspective view of the connecting apparatus of the present invention.

Referring to FIG. 1, the connecting apparatus of the present invention includes a top circuit board 10 and a bottom circuit board 12. Both circuit boards 10,12 are equipped with a pin grid array socket 14,16 or at least a plurality of pin receptacles arranged on a pin grid array layout. The pin grid array sockets are vertically aligned with each other.

The top circuit board is larger and contains circuitry 18 for processing electronic signals. It also contains electrical connectors 20 for communicating with a microprocessore system development instrument of some sort (not shown) over a cable or flexible circuit 22.

Figure 2:
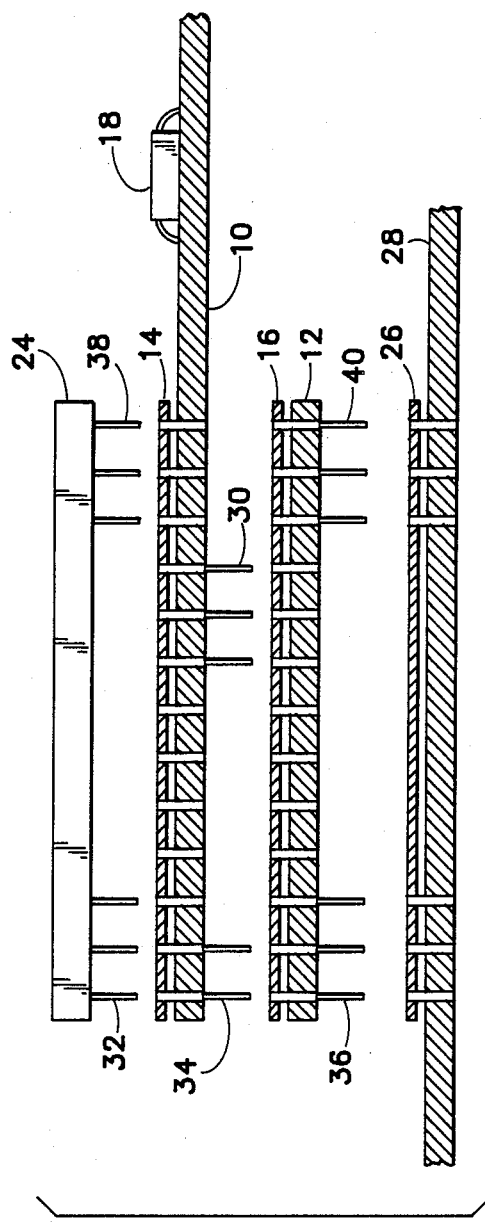
FIG. 2 is side-on cut-away view of the connecting apparatus of the present invention positioned between an electronic device and a prototype system.

Referring to FIG. 2, an electronic device 24, typically a microprocessor, normally resides in a pin grid array socket 26 on a circuit board 28 that is part of a prototype system under development. When the connection apparatus of the present inventio is to be used to access the signals by which this electronic device 24 communicates with the prototype system, the device is removed from its normal socket 26 on the circuit board of the prototype 28 and the bottom board 12 of the connection apparatus is installed in this socket instead. While the pins 30 associated with the top board 10 are normally inserted into the socket 16 on the bottom board 12, they are shown separated for ease of viewing, and may in fact be separated for maintenance or other purposes. The electronic device 24 is then inserted inthe pin grid array socket 14 on the top board 10.

When the elctronic device 24, the parts of the connection apparatus, and the prototype socket 26, are all inserted into each other (i.e., compressed vertically as compared with the way they are shown in FIG. 2), some of the signal paths between the electronic device and the prototype circuit board 28 are closed with a direct connection, while others are effectively interrupted for interactive monitoring. A signal on pin 32 on the electronic device 24 is put in electrical contact with the corresponding location of its normal socket 26 via pin 34 on the top board 10 and pin 36 on the bottom board 12.

However, a signal on pin 38 of the electronic device 24 is not put in direct electrical contact with its corresponding location of its normal socket 26 because no pin is present on the top board at the location corresponding to the location of pin 38 on the device and pin 40 on the bottom board 12. Instead, a signal such as this may be rerouted by conductive runs (not shown) on top board 10 for some sort of processing or modification by electrical circuitry on the top board, represented by electrical component 18. After such processing or modification, this signal can be routed back to an alternate pin 30 on the top board for connection to the bottom board 12. On the bottom board 12 this signal is routed back to pin 40 by conductive runs (not shown) so that it lines up with its original location in the prototype socket 26.

Figure 3:
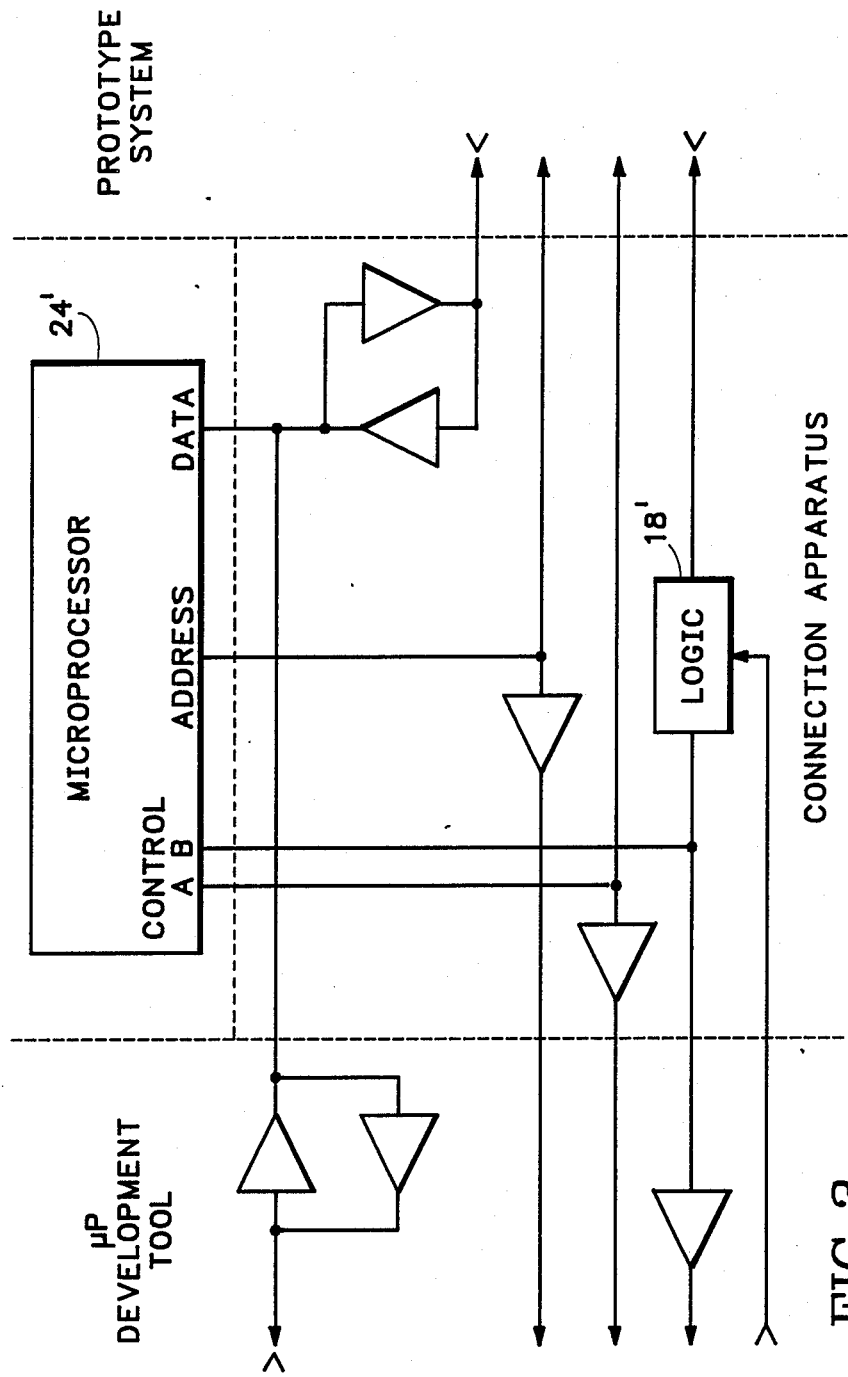
FIG. 3 is a schematic diagram of typical circuitry used to interactively monitor the signals used by a microprocessor to communicate with a prototype system.

FIG. 3 shows a schematic diagram of the type of circuitry that can be used with a connection apparatus according to the present invention. A microprocessor 24' is a specific example of the electronic device 24 shown in FIG. 2. The microprocessor development tool on the left part of FIG. 3 could be an amulator or interactive logic analyzer. The prototype system on the right could include amost anything, but at a minimum includes some random access memory (RAM) for use by the microprocessor 24'.

Direct electrical contact between the microprocessor 24' and the prototype system is appropriate for some signals, such as some of the control lines (A) and all of the address lines. This direct contact occurs when signals travel a path such as that shown in FIG. 2 by pin 32, pin 34, and pin 36. When an interruptible path for interactive monitoring is desired, as it is for the rest of the control lines (B) and all of the data lines, the other type of connection, as shown in FIG. 2 by the pin 38, electrical component 18, pin 30, and pin 40 path, is necessary.

The signals which pass straight through the connection apparatus can be buffered and monitored by the circuitry on the top board 10, but any undesirable electrical effects, such as stray capacitance and lengthy propagation delays, are minimized by the short and direct connection through the vertically aligned pins, e.g. pin 32, pin 34, and pin 36.

The total distance added to the signal path is less than three quarters of an inch for those signals that pass straight through the stack and only a couple of inches for those signals that are interrupted and rerouted. While these signals suffer from additional undesirable electrical effects relative to those that make direct vertical contact, these effects are kept to a minimum by the proximity of the electrical components 18 to the electronic device 24 and the prototype circuit 18. Obviously, a careful layout of the circuitry and conductive paths on the top circuit board 10 so as to minimize run lengths and crosstalk is important to keeping these effects to a minimum.

Although this connection apparatus has been described in a configuration wherein the electrical circuitry is located on the top board, an alternative routing scheme permits the electronic circuitry to reside on the bottom board. Runs on the top board route the intercepted signals to the normally unused pins. These pins transmit these signals to the bottom board, where runs route them out to electronic devices for manipulation. They are then routed back to their original pins for transmission to the device socket on the prototype.

The use of the top board for holding the electronics and connectors is preferable because it is desirable to keep the bottom board as small as the device that it is replacing, so that it does not come in contact with other circuit components in the prototype in the vicinity of the device socket.

While a preferred embodiment of the present invention has been shown and described, it will be apparent to this skilled in the art that many changes and modifications may be made without departing from the invention in its broader aspects. The claims that follow are therefore intended to cover all such changes and modifications as fall within the true spirit and scope of the invention.

We claim:

1. A connection apparatus for accessing the signals sed by an electronic device to communicate with the environment of the electronic device, the electronic device having a plurality of pins arranged for connection to a pin grid array, the apparatus comprising:

a top board, having a top side and a bottom side, the top side having a first pin grid array to receive the pins of the electronic device, the bottom side having a corresponding arrangement of pin locations, but with only a subset of the pin locations actually occupied by pins; and a bottom board, having a top side and a bottom side, the top side having a second pin grid array to receive the pins on the bottom side of the top board, the bottom side having a corresponding arrangement of pin locations, but with only a subset of the pin locations actually occupied by pins;

means on the top board for routing signals from receptacle locations that receive pins from the electronic device but which do not have pins in the corresponding location on the bottom of the top board to locations which do not receive pins from the electronic device and do have pins in the corresponding location on the bottom of the top board; and means on the bottom board for routing signals from receptacle locations that receive pins from the top board but which do not have pins in the corresponding location on the bottom of the bottom board to locations which do not receive pins from the top board and do have pins in the corresponding location on the bottom of the bottom board.

2. An apparatus as recited in claim 1 further comprising means for interactively monitoring the signals used by the electronic device to communicate with the environment of the electronic device, said means disposed within the top board routing menas.

3. An apparatus as recited in claim 2 wherein the means for interactively monitoring is electronic circuitry.

4. An apparatus as recited in claim 3 wherein the electronic circuitry is under the control of a microprocessor development tool.

5. An apparatus as recited in claim 4 wherein the microprocessor development tool is an emulator.

* * * * *